United States Patent
Noda et al.

(10) Patent No.: US 6,468,351 B1
(45) Date of Patent: Oct. 22, 2002

(54) VACUUM PROCESSING APPARATUS WITH IMPROVED MAINTAINABILITY

(75) Inventors: Kazuhiro Noda; Hiroshi Haji; Tetsuhiro Iwai, all of Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 58 days.

(21) Appl. No.: 09/589,227

(22) Filed: Jun. 7, 2000

(30) Foreign Application Priority Data

Jun. 7, 1999 (JP) .......................................... 11-159085

(51) Int. Cl.⁷ ............................................. C23C 16/00
(52) U.S. Cl. .................... 118/715; 118/723 R; 118/729; 156/345.51
(58) Field of Search ............................. 118/715, 723 R, 118/729; 156/345.51

(56) References Cited

U.S. PATENT DOCUMENTS

| 4,147,432 A | * | 4/1979 | Yamawaki et al. | ......... 118/49.1 |
| 4,641,603 A | * | 2/1987 | Miyazaki et al. | ........... 118/724 |
| 4,770,121 A | * | 9/1988 | Ebata et al. | ................. 118/686 |
| 4,889,069 A | * | 12/1989 | Kawakami | .................... 118/50 |
| 5,964,561 A | * | 10/1999 | Marohl | ........................ 414/217 |
| 6,093,904 A | * | 7/2000 | Haji | ....................... 219/121.45 |

FOREIGN PATENT DOCUMENTS

| JP | 357010321 A | * | 1/1982 | ................. 29/25.01 |
| JP | 359066121 A | * | 4/1984 | ................. 118/728 |
| JP | 362237233 A | * | 10/1987 | |
| JP | 405013338 A | * | 1/1993 | ................... 118/50 |

* cited by examiner

*Primary Examiner*—Gregory Mills
*Assistant Examiner*—Michelle Crowell
(74) *Attorney, Agent, or Firm*—RatnerPrestia

(57) ABSTRACT

A vacuum processing apparatus for performing plasma etching in a processing chamber on a base. An actuator, when lowered, forms a closed processing chamber by pressing a lid member onto a work platform, and, when raised, opens the processing chamber by setting the lid member apart from the work platform. The actuator is disposed above the lid member, and frame posts and conveying means, of the work are disposed so as not to block the front side of the lid member, and therefore a free working space for serviceman is kept at the front side of the lid member. Therefore, the serviceman can easily do maintenance work of the lid member or preparation of the processing chamber.

14 Claims, 8 Drawing Sheets

ID OF THE INVENTION

The present invention relates to a vacuum processing apparatus for applying vacuum processing such as plasma processing to a work such as circuit board and electronic component placed in a closed vacuum space.

BACKGROUND OF THE INVENTION

The vacuum processing such as plasma processing is known as a surface treatment method for the work such as circuit board and electronic component.

A vacuum processing apparatus for such purpose comprises a base, a lid member, and an elevating mechanism for lowering the lid member onto the base and raising from the base. A closed processing chamber for processing the work in a vacuum atmosphere is formed by forming a closed space between the base and the lid member when the lid member is put on the base. The vacuum processing apparatus further comprises a conveying mechanism for delivering the work into the processing chamber and discharging the work after processing. In the conventional vacuum processing apparatus, the elevating mechanism of the lid member is disposed at the rear side of the lid member, and the conveying mechanism of the work is disposed at the front side of the lid member.

The vacuum processing apparatus requires preparatory steps such as replacement and position adjustment of pressing member for fixing the work in the processing chamber depending on the type of the work to be processed, and periodic maintenance such as replacement of shielding member for preventing contamination on the inside of the processing chamber.

Accordingly, the vacuum processing apparatus is desired to be designed to allow an easy access to the inside of the processing chamber at the time of such servicing.

However, in the conventional vacuum processing apparatus, the access to the inside of the processing chamber is impeded by the conveying mechanism disposed at the front side of the lid member, and working efficiency in preparatory steps or maintenance is poor, and it takes a long time in job.

It is hence an object of the invention to solve such problems and present a vacuum processing apparatus of an excellent maintainability.

SUMMARY OF THE INVENTION

The vacuum processing apparatus of the invention comprises a base, a work platform on the base, a lid member forming a processing chamber when put on the work platform, an actuator for lowering the lid member onto the work platform and raising from the work platform, a frame having a post being set up in the rear part of the base, and conveying means for delivering the work into the work platform, and discharging from the work platform.

In a first aspect of the invention, the frame supports the lid member from above through the actuator, and the conveying means is positioned between the frame post set up in the rear part of the base and the lid member. As a result, a free working space for serviceman is provided at the front side of the lid member. Therefore, the serviceman can easily access the lid member and processing chamber for maintenance from the front side of the lid member.

The frame of the vacuum processing apparatus of the invention further comprises a front post.

In a second aspect of the invention, the front post is set up at a position apart from the front space of the lid member, at the front part of the base. As a result, same as in the first aspect of the invention, there is a free working space for serviceman at the front side of the lid member.

DETAILED DESCRIPTION OF THE INVENTION

As an embodiment of vacuum processing apparatus of the invention, a structure of a plasma etching apparatus is described below while referring to the accompanying drawings.

(First Embodiment)

Figure 1:
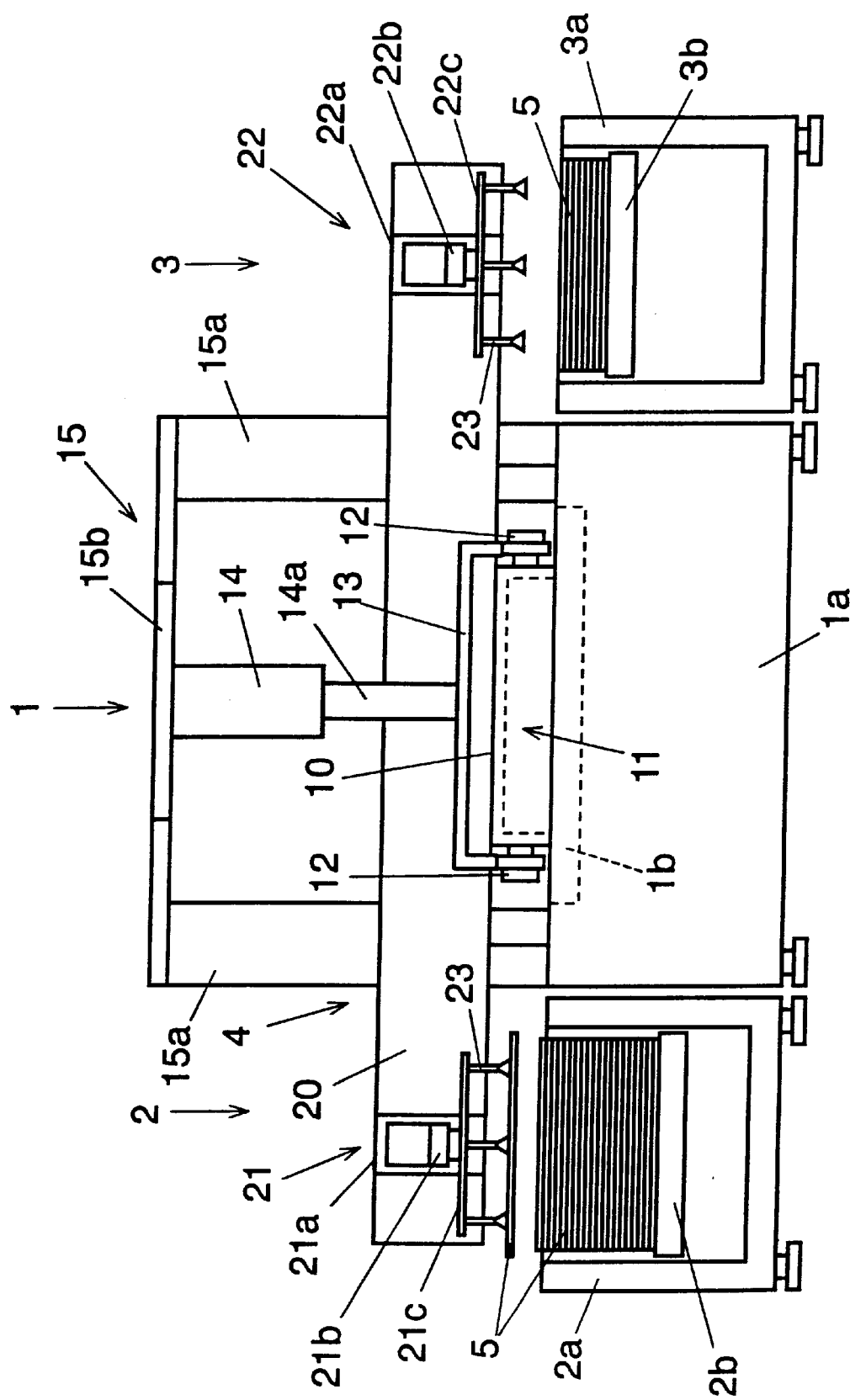
FIG. 1 is a front view of vacuum processing apparatus in a first embodiment of the invention.
Figure 2:
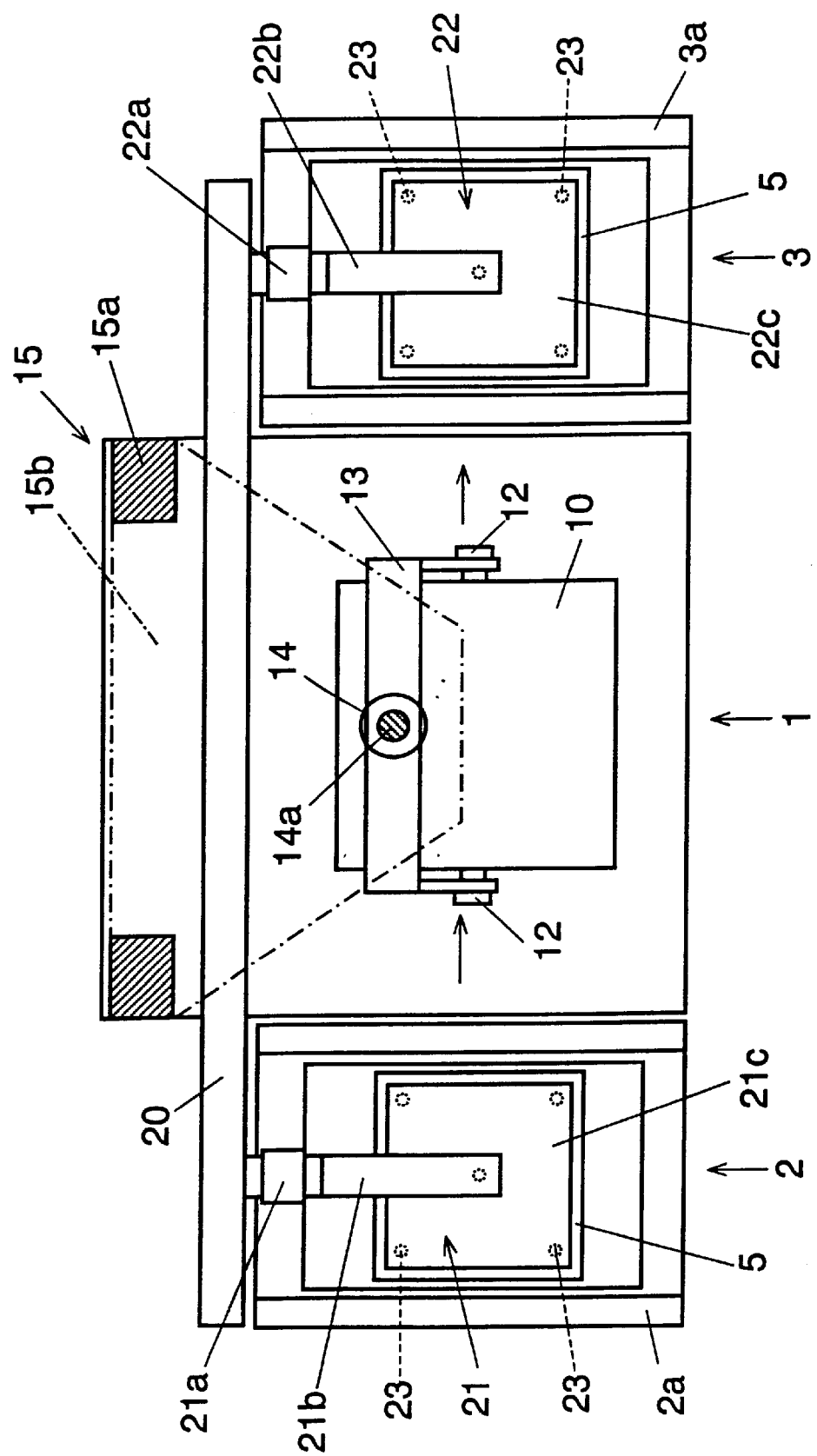
FIG. 2 is a top view of vacuum processing apparatus in the first embodiment of the invention.

As shown in FIG. 1 and FIG. 2, a vacuum processing apparatus in a first embodiment of the invention comprises a vacuum processing section 1, a loader 2 and an unloader 3 disposed at both sides of the vacuum processing section 1, and a conveying section 4.

The loader 2 supplies a work, in this case, a substrate 5 supported by a substrate base member 2b and contained in a container box 2a, into the vacuum processing section 1. The vacuum processing section 1 includes a processing chamber 11 for processing the substrate 5 by plasma etching in a closed vacuum space. The processing chamber 11 is formed between a lid member 10 and a base member 1b disposed on the base 1a.

The lid member 10 forms a closed processing chamber 11 when put on the base member 1b, and opens the processing chamber 11 when departed from the base member 1b. At both sides of the lid member 10, a rotary hinge mechanism 12 having a rotary shaft (not shown) in the horizontal direction is disposed, and the rotary hinge mechanism 12 is fixed to a bracket 13.

By the rotary hinge mechanism 12, the lid member 10 is free to rotate about the rotary shaft on the bracket 13. The bracket 13 is coupled to a rod 14a of a cylinder 14. By lowering the rod 14a, the lid member 10 is pressed onto the base member 1b to close the processing chamber 11, and by raising the rod 14a, the lid member 10 is departed from the base member 1b to open the processing chamber 11. That is, the cylinder 14 is an actuator for moving the lid member 10 to open and close the processing chamber 11.

A frame 15 having a post 15a set up in the rear part of the base 1a, and a horizontal top plate 15b attached to the post 15a is set up on the base 1a, and the cylinder 14 is coupled to the top plate 15b. Therefore, the lid member 10 is supported from above by the frame 15, and the frame 15, cylinder 14, and bracket 13 form a support member for supporting the lid member 10 from above.

The unloader 3 accommodates the substrate 5 after plasma etching processing discharged from the processing chamber 11. The conveying section 4 is a conveying means for conveying the substrate 5, and includes a delivery head 21 and a discharge head 22.

The delivery head 21 and discharge head 22 have conveying arms 21b, 22b moved up and down by elevating mechanisms 21a, 22a, and flat elevating plates 21c, 22c are coupled to the conveying arms 21b, 22b. Plural suction nozzles 23 are attached to the elevating plates 21c, 22c.

The delivery head 21 is positioned on the loader 2, the elevating mechanism 21a is driven and the elevating plate 21c is moved up and down above the substrates 5 stacked up on the loader 2, then the substrate 5 of the highest layer is sucked in vacuum by the suction nozzles 23, and picked up. Picking up the substrate 5, the delivery head 21 is moved horizontally by a moving table 20, and conveys the substrate 5 to the vacuum processing section 1. The discharge head 22 picks up the substrate 5 after plasma processing by the suction nozzles 23, and is moved horizontally by the moving table up to the unloader 3, and puts the substrate 5 into a storage box 3a, to be supported by a substrate base member 3b.

In the construction of the conveying means, omitting the discharge head 22, it may be also designed to deliver the substrate into the vacuum processing section 1 from the loader 2 and discharge the substrate into the unloader 3 by means of the delivery head 21.

Figure 3:
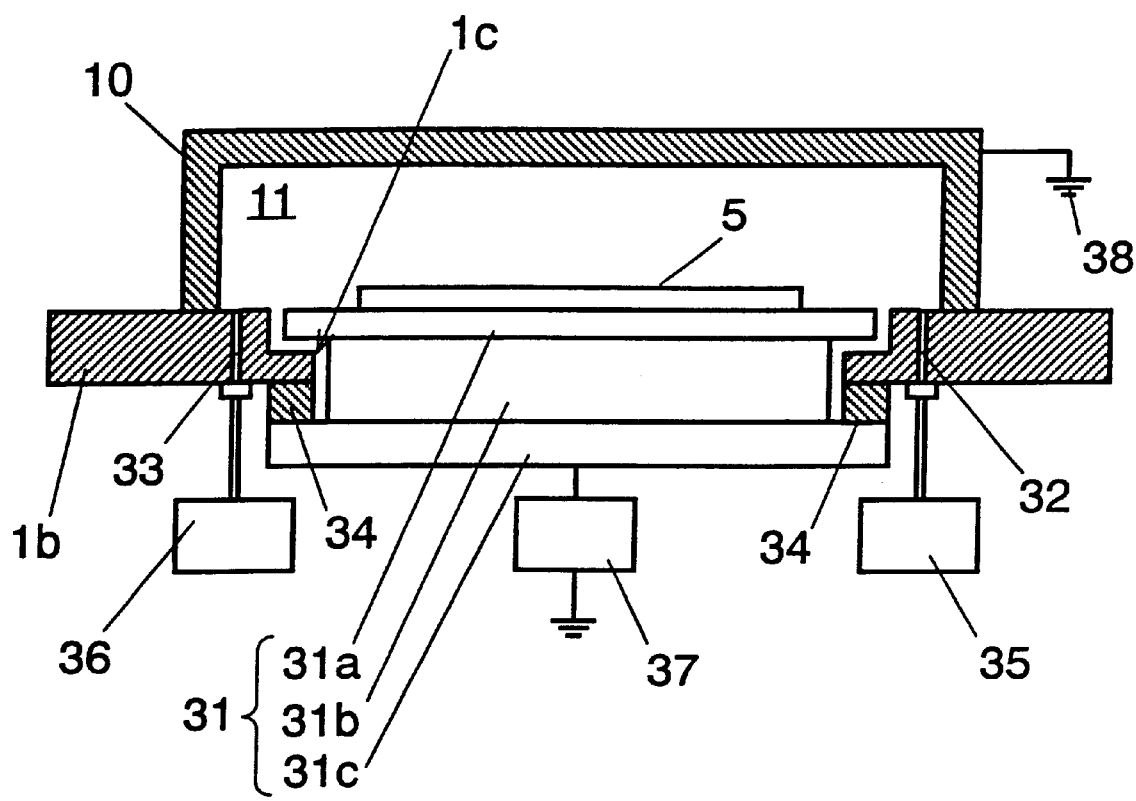
FIG. 3 is a sectional view of processing chamber of vacuum processing apparatus in the first embodiment of the invention.

FIG. 3 is a sectional view of the processing chamber 11 of the vacuum processing section 1. An opening 1c is provided in the base member 1b of flat plate. In the opening 1c, a lower electrode 31 made of three conductive plate members 31a, 31b, 31c is disposed from beneath through an insulating member 34. The plate member 31a of the highest layer of the lower electrode 31 is a work platform 31a provided on the base 1a, and the substrate 5 to be processed by plasma etching is put on the work platform 31a. The lid member 10 is set on the base member 1b.

Two ventilation holes 32, 33 provided in the base member 1b are respectively connected to a vacuum exhaust unit 35 and a gas feed unit 36. By driving the vacuum exhaust unit 35, the inside of the processing chamber 11 is exhausted to vacuum. By driving the gas feed unit 36, plasma generating gas such as argon gas or oxygen gas is supplied into the processing chamber 11.

A high frequency power supply 37 is connected to the lower electrode 31, and by driving the high frequency power source 37, a high frequency voltage is applied between the lid member 10 connected to a grounding unit 38 and the lower electrode 31.

Figure 4:
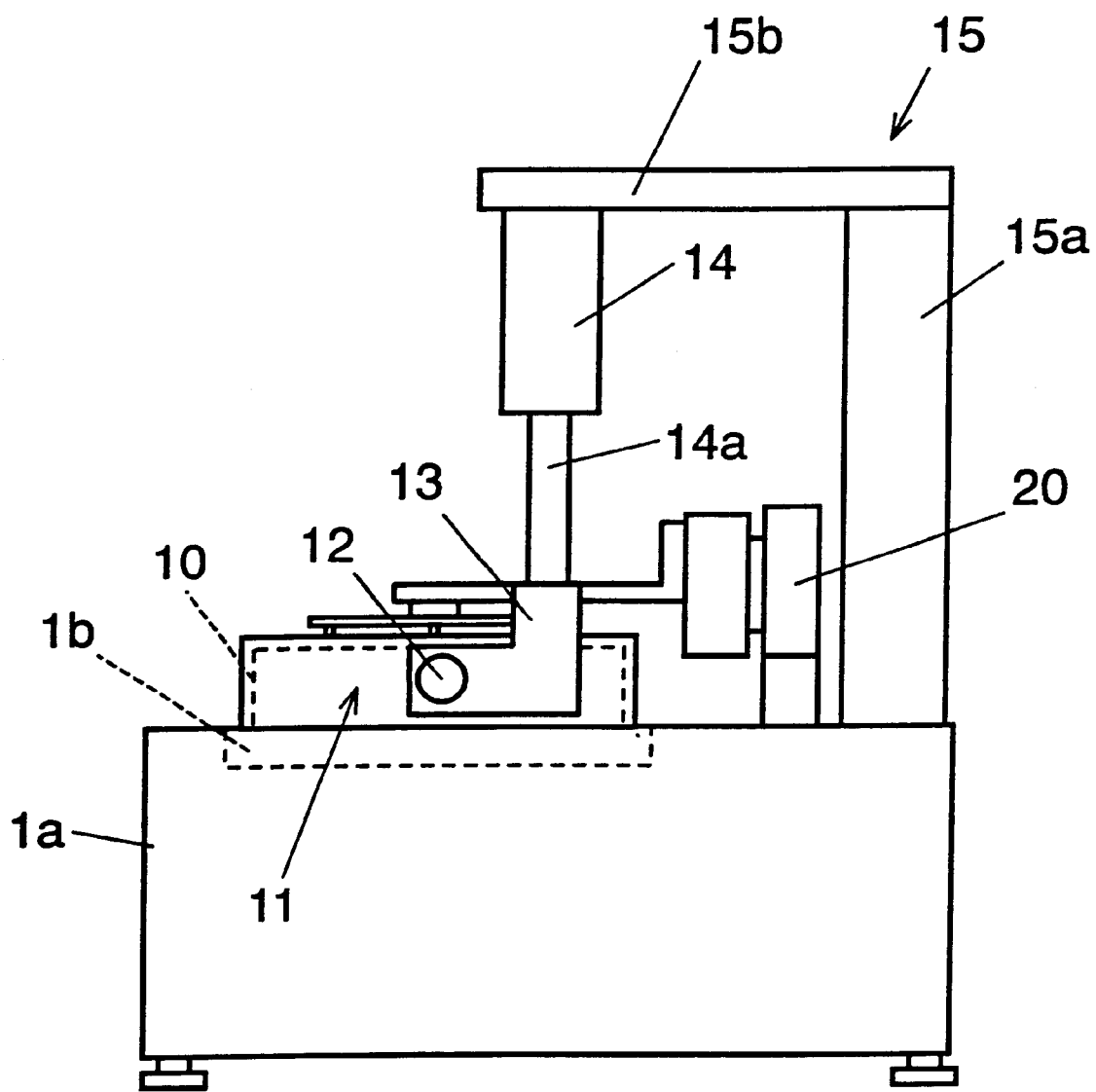
FIG. 4 is a side view of vacuum processing apparatus in the first embodiment of the invention, in which the processing chamber is closed.

FIG. 4 shows a state of pressing the lid member 10 to the base member 1b by lowering the rod 14a of the cylinder 14. In this state, a space between the lid member 10 and the base member 1b forms a closed processing chamber 11 containing a work platform 31a.

Figure 5:
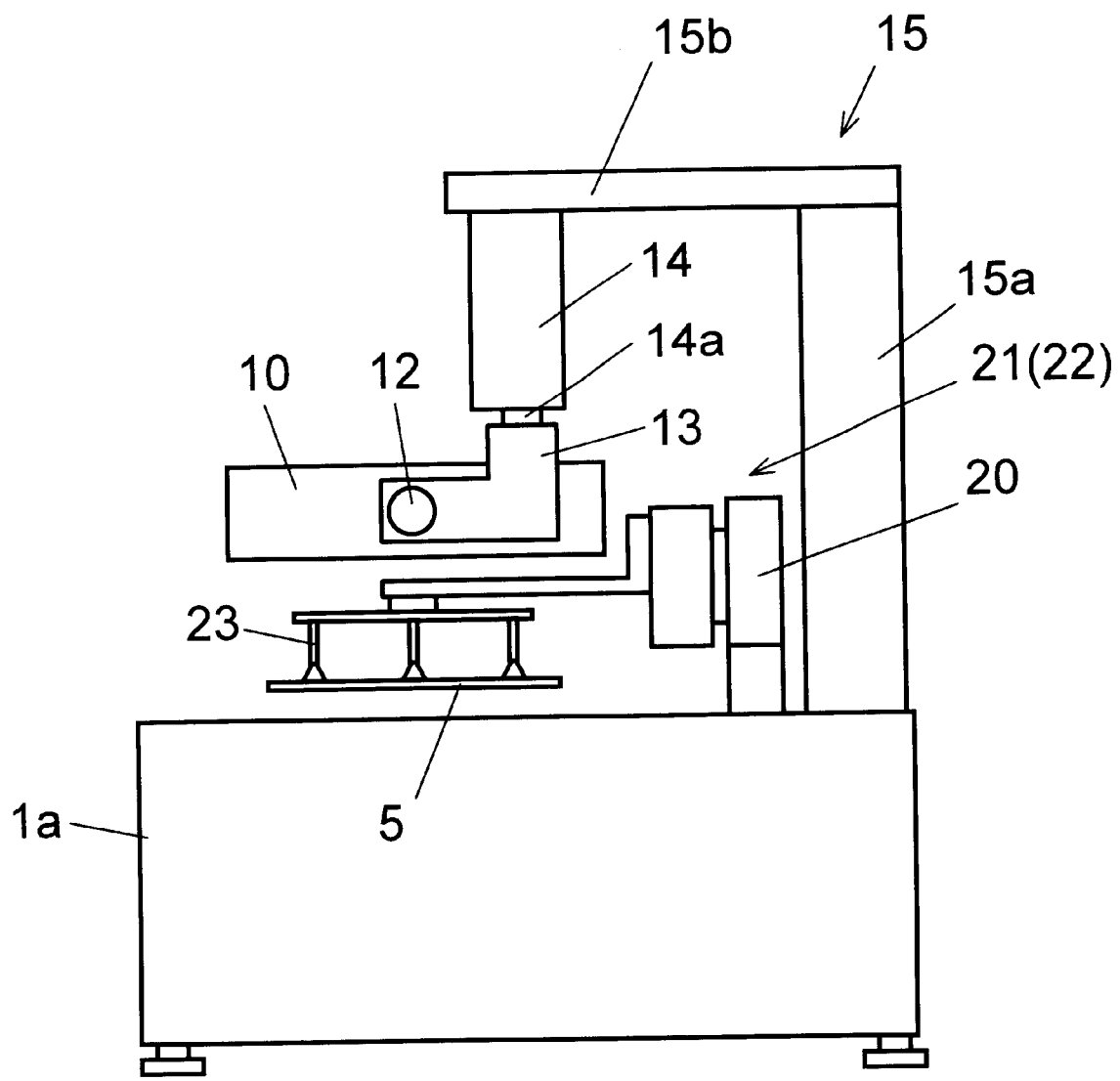
FIG. 5 is a side view of vacuum processing apparatus in the first embodiment of the invention, in which the processing chamber is opened.

FIG. 5 shows a state of setting the lid member 10 apart from the base member 1b to open the processing chamber 11 by raising the rod 14a of the cylinder 14. In this state, since the lid member 10 is at a higher position, delivery of substrate 5 onto the work platform 31a by the delivery head 21, and discharge of substrate 5 from the work platform 31a by the discharge head 22 can be done without interference with the lid member 10.

As shown in the side view of the vacuum processing apparatus of the invention in FIG. 4 and FIG. 5, the projection shape of the frame 15 as seen from the conveying direction of the substrate 5 by the delivery head 21 and discharge head 22 is an inverted L-form by the post 15a set up in-the rear part of the base 1a and the flat top plate 15b fitted to the post 15a.

The moving table 20 for moving the delivery head 21 and discharge head 22 is disposed before the post 15a. That is, the conveying means for delivering the substrate 5 into the work platform 31a in the processing chamber 11, and discharging from the work platform 31a is disposed in the space between the post 15a of the frame 15 and the lid member 10. Accordingly, at the front side of the base 1a, there is a free working space for serviceman, being free from actuator or conveying means for moving the lid member 10.

Figure 6:
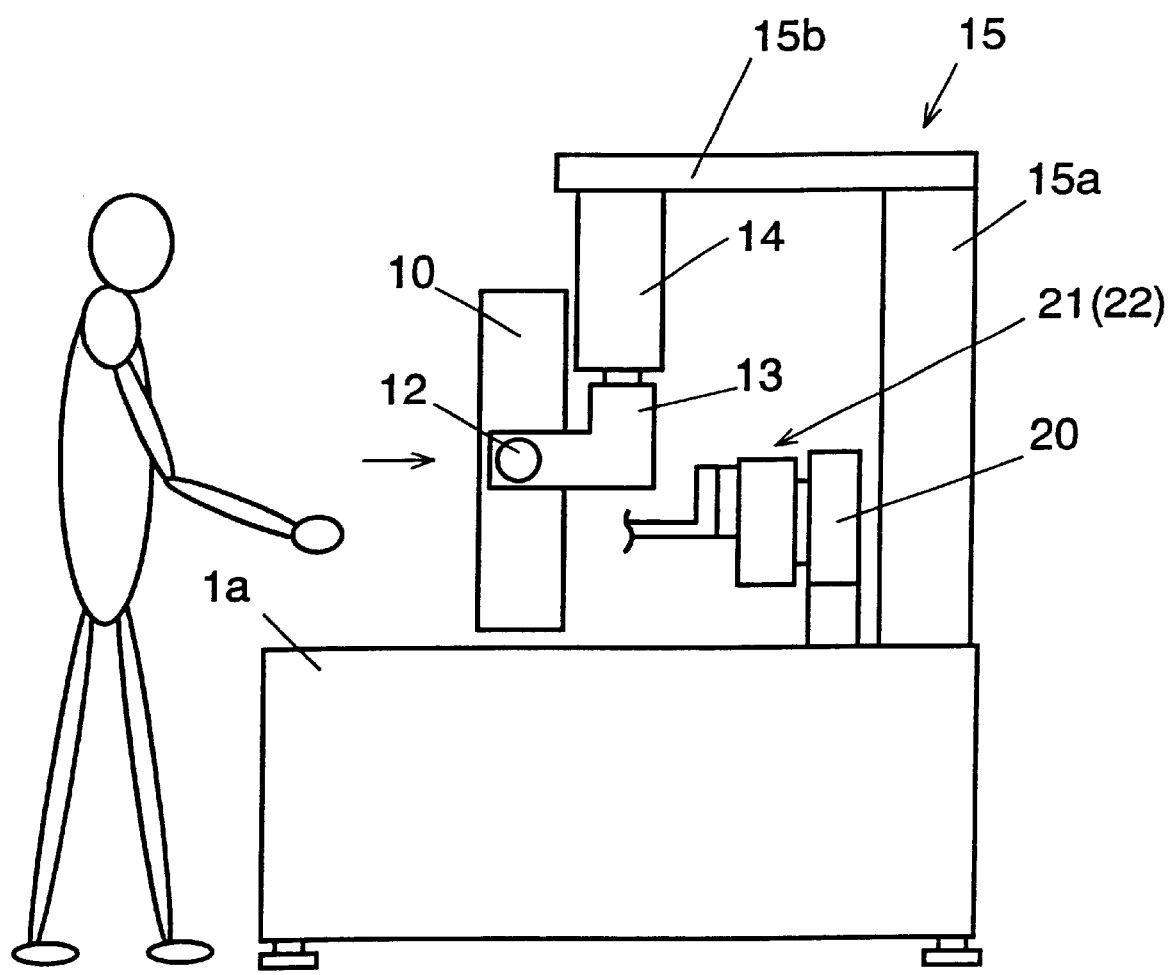
FIG. 6 is a side view of vacuum processing apparatus in the first embodiment of the invention, in which the processing chamber is turned so that the inside of the lid member is directed to the serviceman.

As shown in FIG. 6, by the rotary hinge mechanism 12 disposed at both sides of the lid member 10, the inside of the lid member 10 may be directed to the serviceman standing before the base 1a. The front space of the base 1a is a free space free from actuator and conveying means as described above, and there is no obstacle for the work between the serviceman and the lid member 10 which is the object of service.

The operation of the plasma etching apparatus of the embodiment is described below.

(1) When the lid member 10 is raised, the delivery head 21 picks Up the substrate 5 from the loader 2, and puts on the work platform 31a of the vacuum processing section 1.

(2) The lid member 10 is lowered to close the processing chamber 11.

(3) Driving the vacuum exhaust unit 35, the inside of the processing chamber 11 is exhausted to vacuum.

(4) Driving the gas feed unit 36, plasma generating gas such as argon gas or oxygen gas is supplied into the processing chamber 11.

(5) Driving the high frequency power supply 37, a high frequency voltage is applied between the lid member 10 and lower electrode 31.

(6) Plasma is generated in the processing chamber 11, and the surface of the substrate 5 is etched by the action of the plasma.

By repeating this etching process, the inside of the processing chamber 11 is contaminated by the matter removed by etching and other deposit, and the shielding member inside the processing chamber 11 is changed and cleaned, and other maintenance jobs are done periodically.

When fixing the substrate to be processed to the work platform 31a, necessary tools must be prepared in the processing chamber 11. As mentioned above, since there is no obstacle for work between the serviceman and the hid member 10, such preparation and maintenance works can be done efficiently.

(Second Embodiment)

Figure 7:
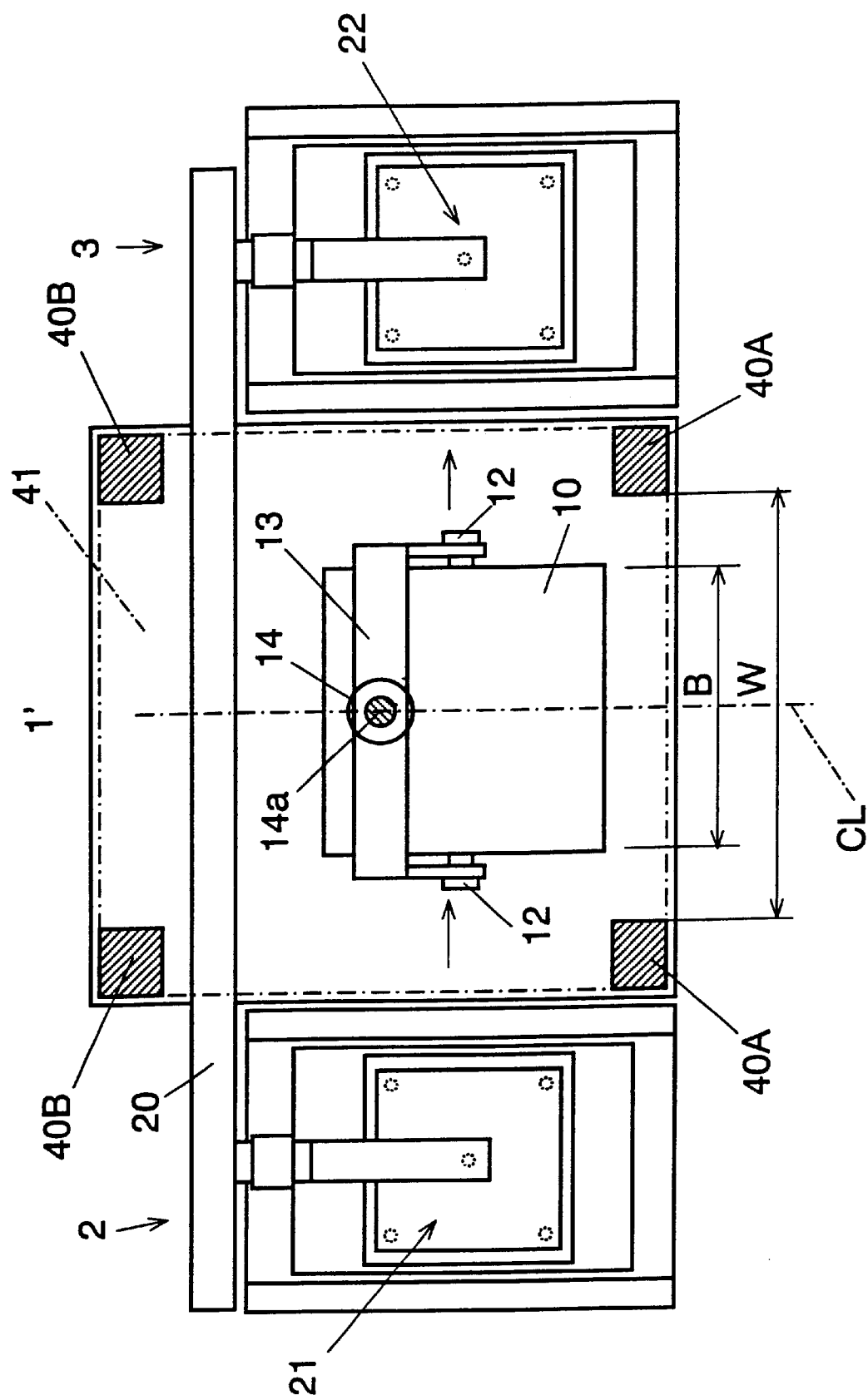
FIG. 7 is a top view of vacuum processing apparatus in a second embodiment of the invention.
Figure 8:
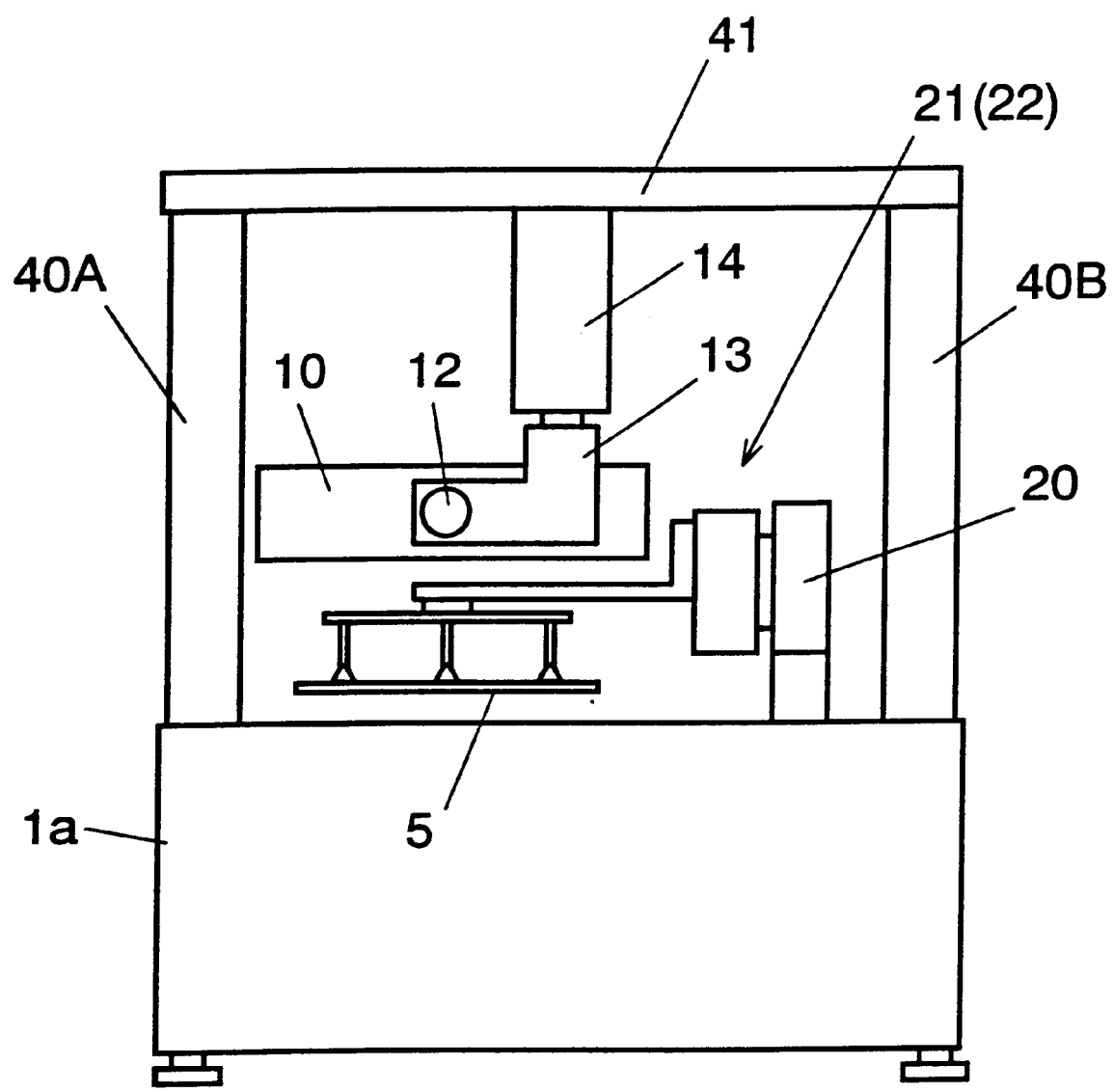
FIG. 8 is a side view of vacuum processing apparatus in the second embodiment of the invention.

FIG. 7 and FIG. 8 are top and side views of vacuum processing apparatus in a second embodiment of the invention.

Two front posts 40A are set up in the front part on the base 1a, and two posts 40B in the rear part, on both sides of the conveying route (arrow in FIG. 7) of substrates including the delivery head 21 and discharge head 22. These four posts are linked horizontally by a top plate 41 in the upper part, and a portal frame is formed.

As shown in FIG. 8, the projection shape of the frame as seen from the conveying direction of the substrate 5 is a portal profile by the front posts 40A set up in the front part of the base 1a, posts 40B set up in the rear part, and horizontal top plate 41 mounted on the posts.

In the center of the top plate 41, as the actuator, a cylinder 14 is disposed downward same as in the first embodiment. A bracket 13 support the lid member 10 through the rotary hinge 12. That is, the lid member 10 is supported from above by the portal frame through the actuator.

By forming the frame for supporting the lid member 10 in a portal profile, the rigidity of the frame is increased, and deflection or deformation of frame due to load can be decreased. The moving table 20 for moving the delivery head 21 and discharge head 22 is disposed before the posts 40B.

That is, the conveying means for delivering the substrate 5 into the lo work platform 31a in the processing chamber 11, and discharging from the work platform 31a is disposed in the space between the posts 40B and the lid member 10. Besides, as shown in FIG. 7, the interval W of two front posts 40A is sufficiently wide as compared with the width B of the lid member 10. That is, the front post 40A is set up at a position remote from the front of the lid member 10.

Therefore, same as in the first embodiment, there is no obstacle impeding the work between the serviceman and the lid member 10, so that preparation of the processing chamber and maintenance work can be done efficiently.

In the first and second embodiments, the plasma etching apparatus is presented as an example of vacuum processing apparatus, but the invention is not limited to this example, and include, for example, a film forming apparatus for forming a film by adhering particles of covering material in a processing chamber for processing substrates or electronic components.

EFFECTS OF THE INVENTION

In a vacuum processing apparatus of the invention, an actuator for supporting a lid member is disposed above, and conveying means for delivering and discharging the work is disposed between the frame post and lid member, and therefore the front area of the vacuum processing apparatus is kept as a free working space for serviceman, so that it is easy to work, while the maintainability is improved.

What is claimed is:

1. A vacuum processing apparatus with a processing chamber for processing a work; comprising:

a base;

a work platform on said base;

a lid member forming a processing chamber when put on said work platform;

an actuator for lowering said lid member onto said work platform and raising from said work platform, said actuator being located over said lid member;

a frame having supporting posts set up in the rear part of said base, said frame supporting said lid member from above;

conveying means for delivering the work onto said work platform, and discharging from said work platform, said conveying means being disposed between said supporting posts and said lid member;

a supply container for supplying the work to said conveying means, said supply container positioned at a first side of said vacuum processing apparatus; and a storage container for storing the work discharged from said conveying means, said storage container positioned at a second side of said vacuum processing apparatus opposite said first side.

2. The vacuum processing apparatus of claim 1, wherein the projection shape of said frame as seen from the work conveying direction of said conveying means is an inverted L-shape.

3. The vacuum processing apparatus of claim 1, wherein said frame further includes front posts, and said front posts are set up at position remote from the front side of said lid member, at the front side of said base, and the projection shape of said frame as seen from the work conveying direction of said conveying means is a portal profile straddling over the work conveying route.

4. The vacuum processing apparatus of claim 1, wherein said vacuum processing apparatus is a plasma etching apparatus.

5. The vacuum processing apparatus of claim 1, wherein said vacuum processing apparatus is a film forming apparatus.

6. The vacuum processing apparatus of claim 1, wherein said actuator is a cylinder having a movable rod.

7. The vacuum processing apparatus of claim 1, further comprising:

a rotary hinge attached to said lid member, wherein said rotary hinge can rotate said lid member so that the inside of the lid member may be directed downward and forward.

8. A vacuum processing apparatus with a processing chamber for processing a work, comprising:

a base;

a work platform on said base;

a lid member forming a processing chamber when put on said work platform;

an actuator for lowering said lid member onto said work platform and raising from said work platform, said actuator being located over said lid member;

a frame having supporting posts set up in the rear part of said base, said frame supporting said lid member from above through said actuator; and conveying means for delivering the work onto said work platform, and discharging from said work platform, said conveying means being disposed between said supporting posts and said lid member.

9. The vacuum processing apparatus of claim 8, wherein said frame as seen from a work conveying direction of said conveying means has a projection shape which is an inverted L-shape.

10. The vacuum processing apparatus of claim 8, wherein said frame further includes front posts, and said front posts are positioned remote from the front side of said lid member, at the front side of said base, and said frame as seen from a work conveying direction of said conveying means is a portal profile straddling over the work conveying route.

11. The vacuum processing apparatus of claim 8, wherein said vacuum processing apparatus is a plasma etching apparatus.

12. The vacuum processing apparatus of claim 8, wherein said vacuum processing apparatus is a film forming apparatus.

13. The vacuum processing apparatus of claim 8, wherein said actuator is a cylinder having a movable rod.

14. The vacuum processing apparatus of claim 8, further comprising:

a rotary hinge attached to said lid member, wherein said rotary hinge can rotate said lid member so that an inside of the lid member is directable downward and forward.

* * * * *